United States Patent [19]

Cornelissen

[11] Patent Number: 4,801,826

[45] Date of Patent: Jan. 31, 1989

[54] CMOST INPUT BUFFER FOR TTL LEVEL INPUT SIGNALS

[75] Inventor: Bernardus H. J. Cornelissen, Eindhoven, Netherlands

[73] Assignee: U.S. Philips Corporation, New York, N.Y.

[21] Appl. No.: 46,975

[22] Filed: May 5, 1987

[30] Foreign Application Priority Data

Jul. 30, 1986 [NL] Netherlands .................. 8601953

[51] Int. Cl.[4] .................. H03K 4/58; H03K 3/013; H03K 19/017; H03K 17/04

[52] U.S. Cl. .................. 307/482; 307/272.2; 307/578; 307/475; 323/315; 307/296R

[58] Field of Search ............... 307/482, 578, 579, 451, 307/443, 585, 473, 475, 270, 601, 603, 272.1, 272.2, 296.1; 323/312, 315

[56] References Cited

U.S. PATENT DOCUMENTS

| | | | |
|---|---|---|---|
| 3,959,782 | 5/1976 | Dunn | 307/482 X |
| 4,063,117 | 12/1977 | Laugesen et al. | 307/482 X |
| 4,380,710 | 4/1983 | Cohen et al. | 307/475 |
| 4,555,644 | 11/1985 | Devecchi et al. | 307/482 |
| 4,677,313 | 6/1987 | Mimoto | 307/482 X |
| 4,680,488 | 7/1987 | Okumura et al. | 307/482 |
| 4,692,638 | 9/1987 | Stiegler | 307/482 X |

OTHER PUBLICATIONS

Fink et al, *Electronics Engineers' Handbook*, McGraw-Hill, pp. 16-15 to 16-19, 1982.

Primary Examiner—John S. Heyman
Assistant Examiner—David R. Bertelson
Attorney, Agent, or Firm—Steven R. Biren

[57] ABSTRACT

A supply voltage originating from the charge present across a buffer capacitance connected in parallel with a logic gate including CMOS transistors is present across this gate. The loss of charge occurring when the capacitively loaded gate output is charged must be replenished. To this end there is provided a small direct current source feeding the buffer capacitance.

9 Claims, 2 Drawing Sheets

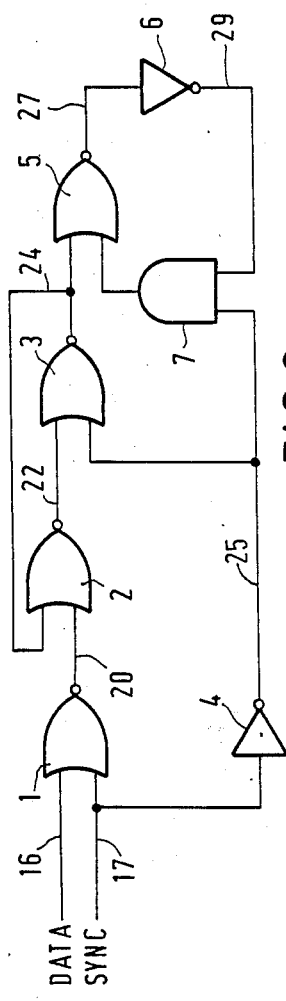
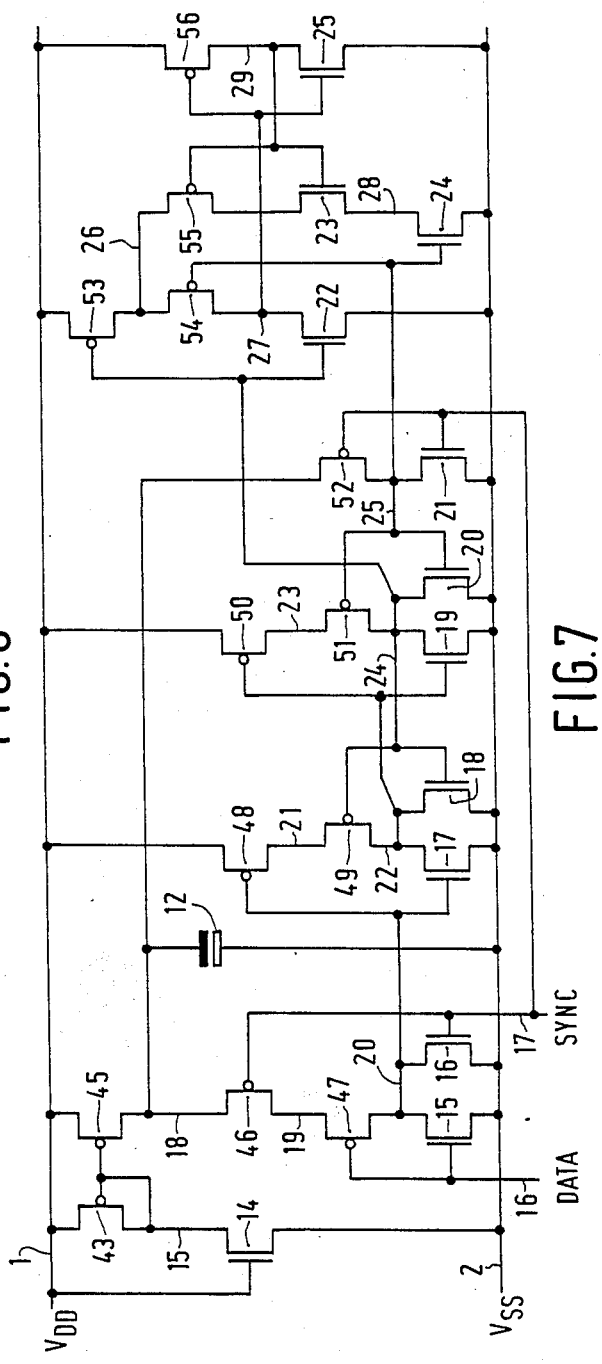

CMOST INPUT BUFFER FOR TTL LEVEL INPUT SIGNALS

BACKGROUND OF THE INVENTION

The invention relates to an input buffer with CMOS transistors. The invention more particularly relates to an input buffer for TTL level input signals. The invention relates to a synchronous as well as an asynchronous input buffer.

An input buffer of this kind is known from U.S. Pat. No. 4,380,710, which discloses an asynchronous input buffer which comprises CMOS transistors and which is suitable for TTL level input signals. The input buffer is constructed around an inventer which is connected between two supply voltages at the CMOS level. The output of the inverter is assumed to be capacitively loaded. The N-channel transistor and the P-channel transistor of the inverter form part of a controlled leg of a first current mirror and a second current mirror, respectively. The controlled leg of the first current mirror comprises a current source, which supplies a current which varies as a function of the amplitude of the signal on the inerter input.

The controlled leg of the second current mirror comprises a current sink whose current also varies as a function of the signal on the inverter input. The trip-point of the inverter is determined by a reference voltage applied to the inputs of the current mirrors. Because the input signal never reaches the level of the applied CMOS supply voltages, the N-channel and P-channel transistors are never sufficiently turned off for realizing the complete or fast charging or discharging of the capacitive output load to a CMOS supply voltage level. Therefore, when TTL level input signals are applied, the current source and the current sink must realize fast and substantially complete charging or discharging, respectively, of the capacitive output load in order to obtain a voltage swing on the inverter output covering substantially the entire difference between the applied supply voltages.

Drawbacks of the input biffer disclosed in U.S. Pat. No. 4,380,710 are its high current consumption, its large number of components, the necessity of adding a circuit for supplying the stable reference voltage, and its susceptibility to fluctuations in the supply voltages which are liable to cause incorrect signals on the output of the input buffeer.

SUMMARY OF THE INVENTION

It is an object of the invention to provide an input buffer which is driven by clock signals (in the synchronous case) or not (in the asynchronous case), which comprises CMOS transistors, which is fast (rise time in the order of 5 nsec), which is constructed using a small number of elements, whose trip-point is less susceptible to supply voltage fluctuations, and which does not require an external circuit for supplying a stable reference voltage.

To achieve this, a CMOST input buffer in accordance with the invention is characterized in that it comprises:
a first current source which is connected to a first supply terminal and which comprises a first current output;
a first logic gate which is connected between the first current output and a second supply terminal; and
a first buffer capacitance which is connected between the first current output and the second supply terminal.

A supply voltage which equals the voltage across the first buffer capacitance is present across the first logic gate in the CMOST input buffer in accordance with the invention. A capacitive load to be driven is connected to the output of this gate. If said first current source were absent, then, in the case of variations of the input signals, the gate would continue to transfer charge from the buffer capacitance to the capacitive load and from the capacitive load to the second supply terminal until the supply voltage drops below the limit value where all upper P-channel transistors which are present in the gate and which have a main electrode connected to the buffer capacitance remain turned off, regardless of the amplitude of the signals received on their control electrodes. As from that instant, the capacitive load would no longer receive a charge and, once discharged, it would remain discharged. The loss of charge of the buffer capacitance due to the transfer to the capacitive load, therefore, must be compensated for by current supply to the buffer capacitance. When it is assumed that all upper P-channel transistors receive a high-level voltage $V_H$ on their control electrodes, the current supply will charge the buffer capacitance until the difference between the voltage across the buffer capacitance and the high level $V_H$ exceeds a threshold voltage $V_{TP}$ of an upper P-channel transistor. At that instant this transistor is turned on. For P-channel transistors connected in series with the latter transistor, a similar consideration holds good when they also receive a high-level voltage $V_H$ on their respective control electrodes. Ultimately, a DC path to the second supply terminal is thus formed and a steady state arises in which the current supply to and the current drain from the buffer capacitance are balanced. The value $V_{st}$ of this stable voltage in the case of a high input voltage $V_H$ on all upper transistors, therefore, is larger than the sum of $V_H$ and the threshold voltage $V_{TD}$.

The capacitive load on the output of the first logic gate is formed by an input of a second logic gate with CMOS transistors. The order of magnitude of this capacitive load is $10^{-12}F$. A voltage across this capacitive load, which is interpreted by the second gate as being a high CMOS level, should be higher than 2.5 V. This high level arises when the charge present across the first buffer capacitance is distributed between this buffer capacitance and the capacitive load. It is assumed that the initial voltage across the capacitive load equals zero. The redistribution of the charge determines the initial value of the high output voltage of the first gate, while the current source ensures that this output level continues to rise due to the supply of charge to both capacitances. The fact that the stable voltage $V_{st}$ is larger than $(V_H+V_{TP})$ determines the order of magnitude of the buffer capacitance in conjunction with the given order of magnitude of the capacitive load ($10^{-12}F$) and the requirement that the initial value of the high output voltage should be higher than 2.5 V. Utilizing TTL input signals and a threshold voltage of 1 V, this leads to a buffer capacitance of at least from 3 to 5 times that of the capacitive load. For an input signal frequency of 10 MHz, approximately 20 μA is then drained from the buffer capacitance; this charge must be replenished by a current source of approximately 20 μA. It is to be noted that the susceptibility to supply voltage fluctuations of the input buffer in accordance with the invention is low as a result of the smoothing effect of the buffer capacitance.

A preferred embodiment of a CMOST asynchronous input buffer in accordance with the invention is characterized in that a second inverter is connected to a gate output of the first logic gate, which second inverter is arranged between the first and the second supply terminal. The use of this second CMOS inverter as an output stage offers the advantage that its output reaches a high level more quickly than the output of the first gate, because the high level on the latter output increases slowly from a value slightly above 2.5 V when a small current is applied. An additional advantage is that the first logic gate as well as the second CMOS inverter can be proportioned as standard CMOS gates.

In the case of synchronous input buffers for data and clock signals use cannot be made of a separate input buffer for the data and a separate input buffer for the clock signals without introducing additional delays. Because of process tolerances during the manufacture of the individual input buffers and the occurrence of temperature gradients during use, the phase relationship between the data and the clock signals is liable to be disturbed. In order to ensure that the phase relationship is maintained, the synchronous input buffer in accordance with the invention utilizes the structure of a master-slave flipflop.

A preferred embodiment of a CMOST synchronous input buffer in accordance with the invention is characterized in that it includes a first logic gate which comprises a clock signal input and a data input, which first logic gate forms part of a master-slave flipflop comprising a plurality of logic gates, the first and the second supply input of at least the first logic gate being connected to the first current output and the second supply terminal, respectively.

BRIEF DESCRIPTION OF THE DRAWINGS

The invention will be described in detail hereinafter with reference to the accompanying diagrammatic drawings; ,in which

FIG. 6 shows the logic gate diagram of the preferred embodiment of a CMOST synchronous input buffer for TTL level data and TTL level clock signals; and FIG. 7 shows the transistor diagram of the gate circuit of FIG. 6.

DESCRIPTION OF THE PREFERRED EMBODIMENTS

Figure 1:
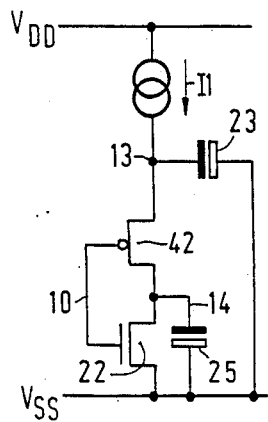
FIG. 1 shows the circuit diagram of an input buffer in accordance with the invention.

FIG. 1 shows the circuit diagram of an input buffer in accordance with the invention. The input buffer comprises a logic gate (an inverter) having a buffer capacitance 23 which is connected parallel thereto, and a direct current source $I_1$ which is connected to a junction 13 of the buffer capacitance and the inverter. The gate comprises a series connection of an NMOS transistor 22 and a PMOS transistor 42, an output connection 14, and an input connection 10. The output load of the inverter is formed by a capacitive load 25. The supply voltage across the inverter 22/42 is supplied by the buffer capacitance 23. This buffer capacitance looses its charge only when charge is transferred to the load capacitance 25 via the conductive PMOS transistor 42. This charge loss is replenished by the current source $I_1$. The operation of this circuit will be described in detail hereinafter whith reference to FIG. 2.

Figure 2:
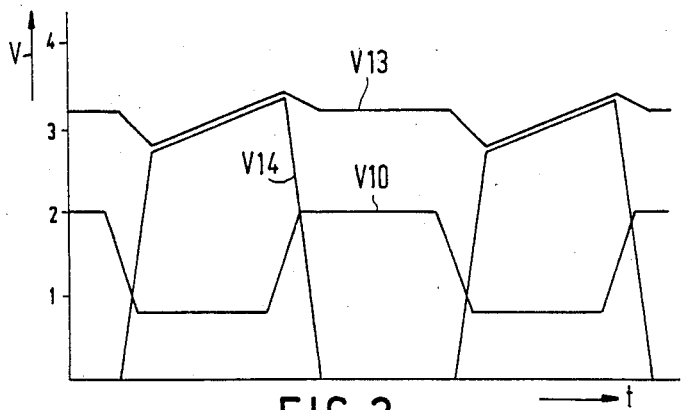
FIG. 2 illustrates the behavior of the circuit shown in FIG. 1 in response to the supply of TTL level input signals.

FIG. 2 illustrates the behavior of the circuit shown in FIG. 1 when TTL level input signals are applied to the input connection 10. It is assumed that the input signal has initially been so high (2V), and hence the transistor 22 turned on, that the output voltage across the load capacitance 25 has become substantially zero. The current source $I_1$ has then charged the buffer capacitance 23 so far that the P-transistor 42 is turned on and transfers an amount of current to ground, via the N-transistor 22, which equals the amount of current received by the buffer capacitance 23 from the current source $I_1$. The stable voltage $V_{st}$ prevailing in this stage of equilibrium and present across the buffer capacitance 23, therefore, is larger than the sum of the input voltage (2V) and the threshold voltage $V_{TP}$ of the P-transistor 42. For the sake of simplicity this threshold $V_{TP}$ is assumed to be 1V. When the input signal changes from high to low (0.8 V), the threshold of N-transistor 22 being 1V, the N-transistor 22 is turned off and the P-transistor 42 is turned on. The charge present across the buffer capacitance 23 in said state of equilibrium is then immediately distributed between the load capacitance 25 and the buffer capacitance 23. Consequently, the voltage across the latter capacitance decreases and the voltage across the former capacitance increases. The level of the voltage across the load capacitance 25 should be higher than 2.5 V immediately after the distribution, because this load capacitance 25 represents the input capacitance of a second CMOS gate which must interprete a high level. For a given input capacitance of $10^{-12}F$ and an initial value of the stable voltage $V_{st}$ of 3.2 V this condition results in a minimum capacitance value from approximately $3 \cdot 10^{-12}F$ to $5 \cdot 10^{-12}F$ for the buffer capacitance 23. Thus, the charge received by the load capacitance 25 per transition amounts to approximately $2.5 \cdot 10^{-12}C$.

After this distribution of the charge, the voltage across the load capacitance 25 as well as the voltage across the buffer capacitance 23 will slowly increase as a result of the supply of charge by the current source $I_1$. Because a charge then also flows via the P-transistor 42, a small voltage difference will exist between the buffer capacitance 23 and the load capacitance 25. The voltages across the capacitances increase by the same amount until the input signal becomes high again. The load capacitance 25 will then be discharged via the turned-on N-transistor 22. At the same time a large voltage drop occurs across the main electrodes of the P-transistor 42, with the result that the latter allows an amount of charge to be drained from the buffer capacitance 23 as to reach the above stable voltage $V_{st}$. When the input signals oscillate with a frequency of 10 MHz, this means that the current source must supply approximately 24 $\mu A$ in order to compensate for the charge loss of the buffer capacitance.

Figure 3:
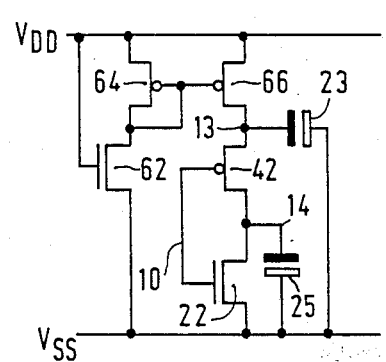
FIG. 3 shows an embodiment of the input buffer shown in FIG. 1.

FIG. 3 shows an embodiment of the circuit shown in FIG. 1. Transistor 62 is of the NMOS type and acts as a current source. The control electrode of the transistor 62 is connected to the supply voltage $V_{DD}$; its first main electrode is connected to the supply voltage $V_{SS}$ while its second main electrode is connected to a first main electrode and the control electrode of a PMOS transistor 64. The transistor 64 forms a current mirror in conjunction with a transistor 66 which is also a PMOS type. The first main electrode of the transistor 66 is connected to the transistor 42 of the inverter and to the capacitance 23. The second main electrode of the transistor 64 as well as the second main electrode of the transistor 66 receive the supply voltage $V_{DD}$.

Figure 4:
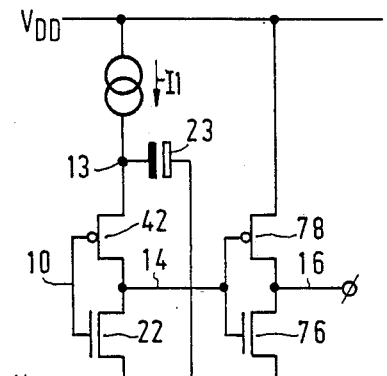
FIG. 4 shows the preferred embodiment of a CMOST asynchronous input buffer for TTL input signals in accordance with the invention.

FIG. 4 shows the preferred embodiment of a CMOS asynchronous input buffer in accordance with the invention for amplifying TTL level input signals. The elements 22, 42, 23, 10, 14 and $I_1$ are the same as those shown in FIG. 1 and have been described with reference to FIG. 2. The high level on the output terminal 14 is comparatively slowly reached because the voltage on the terminal 14 increases from a value slightly larger than 2.5 V while being fed by only a part of the small current $I_1$ as described with reference to FIG. 2. When a second inverter 76/78 is connected to the output 14, which second inverter is connected between supply terminals at the CMOS level, a high and a low level will be reached more quickly on the output of the second inverter. Current source control, like in the first stage of the input buffer, can be dispensed with in the second stage because the high level on the terminal 14 sufficiently quickly reaches the value where the P-transistor 78 is turned off.

Figure 5:
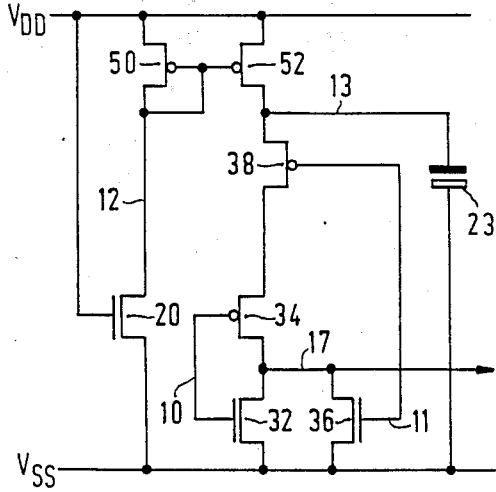
FIG. 5 shows an embodiment of the current source control of a NOR-gate for receiving TTL level input signals in an input buffer in accordance with the invention.

FIG. 5 shows an embodiment of the current source control of a NOR-gate for use in an input buffer in accordance with the invention. A NOR-gate is formed by a parallel connection of NMOS transistors 32 and 36 and a series connection of PMOS transistors 34 and 38, both circuits being connected in series. The NOR-gate is connected parallel to the buffer capacitor 23 which is charged via the current source 20, 50 and 52 in the same way as described with reference to FIG. 3.

FIG. 6 shows the logic gate diagram of the preferred embodiment of a synchronous input buffer for TTL level data and TTL level clock signals in accordance with the invention. This input buffer is constructed as a master-slave flipflop whose gates 1, 2, 3 and 4 form the master section and whose gates 5, 6, and 7 form the slave section. In the case of a low clock signal SYNC on the clock signal input 17, the inverted data signal DATA is present on the gate output of the first NOR-gate 1; in that case DATA is present on the output on the second NOR-gate, the output of the third NOR-gate 3 being low while the output of the inverter 4 being high. Because the AND-gate 7 receives a high input signal and the NOR-gate 5 receives a low input signal on a respective gate input, the slave section retains the data introduced during a preceding cycle, regardless of the events on the DATA input 16. When the clock signal SYNC changes from low to high, the input buffer being constructed so that the output of the gate 3 reaches a new state sooner than the output of the gate 2, the clock signal SYNC changes from low to high, DATA will appear on the gate output of the NOR-gate 3 and the master section will retain this information, regardless of the events taking place on the DATA input 16. At the same time this information is introduced into the slave section.

FIG. 7 shows the transistor diagram of the gate circuit of FIG. 6, NOR-gate 1 of FIG. 6 corresponds to sub-circuit 15-16-46-47, NOR-gate 2 corresponds to sub-circuit 17-18-48-49, NOR-gate 3 corresponds to sub-circuit 19-20-5-51, inverter 4 corresponds to sub-circuit 21-52, and inverter 6 corresponds to sub-circuit 25-56. NOR-gate 5 and AND-gate 7 are formed by the sub-circuit 22-23-24-53-54-55. The gates in the figure whose inputs receive the TTL clock signals or TTL data are the NOR-gate 15-16-46-47 and the inverter 21-52. These two gates receive the current source control as has already been described.

What is claimed is:

1. A CMOST input buffer, which comprises:
   a first current source which is connected to a first supply terminal and which comprises a first current output;
   a first logic gate which is powered via the first current output and via a second supply terminal; and
   a first buffer capacitance which is permanently connected between the first current output and the second supply terminal for stabilizing a supply voltage across the first logic gate.

2. A CMOST input buffer as claimed in claim 1, which also comprises:
   a second current source which is connected to the first supply terminal and which comprises a second current output;
   a second logic gate which is powered via said second current output and via the second supply terminal, a gate output of the first logic gate being connected to a gate input of the second logic gate; and
   a second buffer capacitance which is permanently connected between the second current output and the second supply terminal for stabilizing a supply voltage across the second logic gate.

3. A CMOST input buffer as claimed in claim 1 or 2, wherein at least one of said current sources comprises:
   a first transistor whose control electrode is connected to the first supply terminal and a first main electrode of which is connected to the second supply terminal; and
   a current mirror comprising a second transistor and a third transistor whose respective control electrodes are connected to one another, to a second main electrode of the first transistor as well as to a first main electrode of the second transistor, the second main electrodes of the second and third transistors being connected to the first supply terminal, the respective current output being formed by a first main electrode of the third transistor.

4. A CMOST input buffer as claimed in claim 1 or 2, wherein at least one of said current sources comprises a PMOS transistor whose control electrode is connected to the second supply terminal, a first main electrode thereof being connected to the first supply terminal, the respective current output being formed by a second main electrode thereof.

5. A CMOST input buffer as claimed in claim 1 or 2, wherein at least one of said buffer capacitances has a capacitance value which is from 3 to 5 times larger than the value of a capacitive load on the output of said logic gate fed by the respective current source.

6. A CMOST input buffer as claimed in claim 1, the first current source comprising:
   a first transistor whose control electrode is connected to the first supply terminal and whose first main electrode is connected to the second supply terminal;
a current mirror comprising a second transistor and a third transistor whose respective control electrodes are connected to one another, to a second main electrode of the firs transistor as well as to a first main electrode of the second transistor, the second main electrodes of the second and the third transistors being connected to the first supply terminal, the respective current output being formed by a first main electrode of the third transistor; and
the first buffer capacitance having a capacitance value which is from 3 to 5 lines larger than the value of a capacitive load on an output of the logic gate, an input of an inverter being connected to the output of the logic gate, which inverter is powered via the first and second supply terminal.

7. A CMOST input buffer as claimed in claim 1, 2 or 6, wherein at least one of said logic gates is one of a CMOS inverter, a CMOS NOR-gate and a CMOS NAND-gate.

8. A CMOST input buffer comprising inputs for data and clock signals as claimed in claim 1 or 2, wherein said at least one of said current sources comprises:
a first transistor whose control electrode is connected to the first supply terminal and a first main electrode of which is connected to the second supply terminal;
a current mirror comprising a second transistor and a third transistor whose respective control electrodes are connected to one another, to a second main electrode of the first transistor as well as to a first main electrode of the second transistor, the second main electrodes of the second and third transistors being connected to the first supply terminal, the respective current input being formed by a first main electrode of the third transistor; and
at least one of said buffer capacitances having a capacitance value which is from 3 to 5 times larger than the value of a capacitive load on the output of a said logic gate fed by said current source, the first logic gate having a clock signal input and a data input, which first logic gate forms part of a master-slave flipflop comprising a plurality of logic gates, at least the first logic gate being powered via the first current output and via the second supply terminal.

9. A CMOST input buffer as claimed in claim 8, wherein the master-slave flipflop comprises:
a first NOR-gate comprising a data input and a clock signal input, said first NOR-gate being powered via the first current output and via the second supply terminal;
a second NOR-gate, a first gate input of which is connected to a gate output of the first NOR-gate;
a third NOR-gate, a first gate input of which is connected to a gate output of the second NOR-gate, and a gate output of which is connected to a second gate input of the second NOR-gate;
a first inverter, a gate input of which is connected to the clock signal input, a gate output of which is connected to a second gate input of the third NOR-gate, the first inverter being powered via the first current output and via the second supply terminal;
a fourth NOR-gate, a first gate input of which is connected to a gate output of the third NOR-gate;
a second inverter, a gate input of which is connected to a gate output of the fourth NOR-gate; and
an AND-gate, a first and a second gate input of which are connected to a gate output of the first and the second inverter, respectively, and a gate output of which is connected to a second gate input of the fourth NOR-gate.

* * * * *